United States Patent
Moreira (10) Patent No.: US 9,059,661 B2
(45) Date of Patent: Jun. 16, 2015

(54) VARIABLE-SIZE MIXER FOR HIGH GAIN RANGE TRANSMITTER

(71) Applicant: Intel Mobile Communications GmbH

(72) Inventor: Jose Pedro Moreira, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/829,820

(22) Filed: Mar. 14, 2013

(65) Prior Publication Data

US 2013/0200925 A1    Aug. 8, 2013

Related U.S. Application Data

(63) Continuation of application No. 12/416,604, filed on Apr. 1, 2009, now Pat. No. 8,422,588.

(51) Int. Cl.
| | |
|---|---|
| *H04L 27/04* | (2006.01) |
| *H03B 21/00* | (2006.01) |
| *H03C 5/00* | (2006.01) |
| *H04B 1/04* | (2006.01) |
| *H03M 1/66* | (2006.01) |

(52) U.S. Cl.
CPC ............... *H03B 21/00* (2013.01); *H03C 5/00* (2013.01); *H04B 1/0483* (2013.01); *H03M 1/66* (2013.01); *H04B 1/0475* (2013.01)

(58) Field of Classification Search
USPC ......... 375/295, 296, 300; 455/91, 114.2, 108; 341/144; 710/69
See application file for complete search history.

(56) References Cited

U.S. PATENT DOCUMENTS

| | | | |
|---|---|---|---|
| 4,365,331 A | 12/1982 | Biba et al. | |
| 5,668,506 A | 9/1997 | Watanabe et al. | |
| 6,275,540 B1 | 8/2001 | Barrett, Jr. et al. | |
| 6,856,284 B1 | 2/2005 | Cangiani | |
| 7,221,300 B2 | 5/2007 | Fontaine et al. | |
| 7,372,386 B1* | 5/2008 | Maloberti et al. | 341/144 |
| 7,561,931 B1 | 7/2009 | Kato et al. | |
| 7,586,429 B1 | 9/2009 | Cerusa et al. | |
| 7,702,359 B2 | 4/2010 | Tanaka et al. | |
| 7,729,671 B2* | 6/2010 | Afsahi et al. | 455/127.1 |
| 7,965,728 B2* | 6/2011 | Terryn | 370/413 |
| 8,019,310 B2 | 9/2011 | Sahota et al. | |
| 8,081,937 B2 | 12/2011 | Mirzaei et al. | |
| 8,275,332 B2 | 9/2012 | Mirzaei et al. | |
| 8,422,588 B2* | 4/2013 | Moreira | 375/300 |
| 2003/0038618 A1* | 2/2003 | Gumm | 324/76.53 |
| 2006/0140251 A1* | 6/2006 | Brown et al. | 375/135 |
| 2007/0207762 A1 | 9/2007 | Doerrer | |
| 2007/0293163 A1 | 12/2007 | Kilpatrick et al. | |
| 2008/0205541 A1* | 8/2008 | Rofougaran | 375/269 |
| 2008/0233882 A1* | 9/2008 | Ibrahim | 455/42 |
| 2008/0266011 A1* | 10/2008 | Kuosmanen | 331/175 |

(Continued)

OTHER PUBLICATIONS

"U.S. Appl. No. 13/829,975, Non Final Office Action mailed Feb. 10, 2014", 30 pgs.

(Continued)

*Primary Examiner* — Siu Lee
(74) *Attorney, Agent, or Firm* — Schwegman Lundberg & Woessner, P.A.

(57) ABSTRACT

Implementations of a high gain range transmitter with variable-size mixers are described.

16 Claims, 6 Drawing Sheets

(56) References Cited

U.S. PATENT DOCUMENTS

| | | | |
|---|---|---|---|
| 2008/0318620 A1* | 12/2008 | van Waasen | 455/552.1 |
| 2009/0075620 A1* | 3/2009 | Aniruddhan et al. | 455/326 |
| 2009/0075689 A1* | 3/2009 | Aniruddhan et al. | 455/550.1 |
| 2009/0190692 A1* | 7/2009 | Aniruddhan et al. | 375/295 |
| 2013/0203366 A1 | 8/2013 | Moreira et al. | |

OTHER PUBLICATIONS

"U.S. Appl. No. 12/416,604, Non Final Office Action mailed Mar. 2, 2012", 17 pgs.

"U.S. Appl. No. 12/416,604, Non Final Office Action mailed Aug. 22, 2012", 16 pgs.

"U.S. Appl. No. 12/416,604, Notice of Allowance mailed Dec. 14, 2012", 11 pgs.

"U.S. Appl. No. 12/416,604, Response filed Aug. 2, 2012 to Non Final Office Action mailed Mar. 2, 2012", 15 pgs.

"U.S. Appl. No. 12/416,604, Response filed Nov. 24, 2012 to Non Final Office Action mailed Aug. 22, 2012", 15 pgs.

"U.S. Appl. No. 12/416,604, Supplemental Notice of Allowability mailed Dec. 20, 2012", 8 pgs.

"U.S. Appl. No. 13/829,975, Final Office Action mailed Aug. 20, 2014", 25 pgs.

"U.S. Appl. No. 13/829,975, Response filed Aug. 11, 2014 to Non-Final Office Action dated Feb. 10, 2014", 9 pgs.

\* cited by examiner

VARIABLE-SIZE MIXER FOR HIGH GAIN RANGE TRANSMITTER

RELATED APPLICATION

This application is a Continuing application of co-pending application Ser. No. 12/416,604, which is filed on Apr. 1, 2009. The entire contents of the co-pending application are hereby incorporated herein by reference.

BACKGROUND

Typical communication systems, employing communication standards such as GSM (Global System for Mobile Communication), GPRS (General Packet Radio Service), EDGE (Enhanced Data Rates for GSM Evolution), UMTS (Universal Mobile Telecommunication Systems), and combinations (multi-mode systems), may use transceivers for transmitting and receiving signals. A transceiver can include a high gain range transmitter to transmit signals to communication devices when using any of such communication standards.

In a non-constant envelope phase modulation scheme, a baseband signal containing a baseband phase signal and a baseband amplitude signal is modulated into a high frequency carrier signal, such as a radio frequency (RF) frequency signal or RF signal, for transmission. The baseband phase signal may phase modulate the RF frequency carrier signal producing a phase modulated RF signal. The phase modulated RF signal may further be amplitude modulated by the baseband amplitude signal in a mixer component to produce the non-constant envelope phase modulated RF signal. The amplitude modulation may be sourced from a Digital to Analog Converter (DAC) which transforms the baseband amplitude signal into an analog baseband amplitude signal. The amplitude modulation may be used for exact trajectory of the phase modulated RF signal and may require a high gain range for efficient transmission in a transmitter.

Normally, a transmitter employed in a polar modulation may require a high gain range for transmitting the non-constant envelope phase modulated RF signal. However, present-day mixers are generally not capable of handling high gain ranges. To handle high gains, the mixer may require a larger size which may lead to a distortion problem during a low gain transmission of the modulated RF signal. Furthermore, the larger mixer size produces a relatively high local oscillator (LO) leakage which includes a non-zero RF signal when the baseband amplitude signal is zero. Therefore, a conventional topology of the transmitter in a typical communication device may not meet low distortion and low LO leakage requirements.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

This disclosure is directed towards techniques and methods for implementing a high gain range transmitter with a variable-size mixer in a communication device. The high gain range transmitter with the variable-size mixer can be included in a radio frequency (RF) component of a transmitter. The high gain range transmitter modulates a baseband signal into an RF frequency carrier and produces a modulated RF signal. The modulated RF signal may include a non-constant envelope phase modulated RF signal produced through a mixer component. The mixer component may be susceptible to distortion and local oscillator (LO) leakage in the transmitter output. To achieve low distortion and LO leakage over a high gain range, the mixer component used in a conventional topology is subdivided into smaller sub-mixer components.

Figure 1:
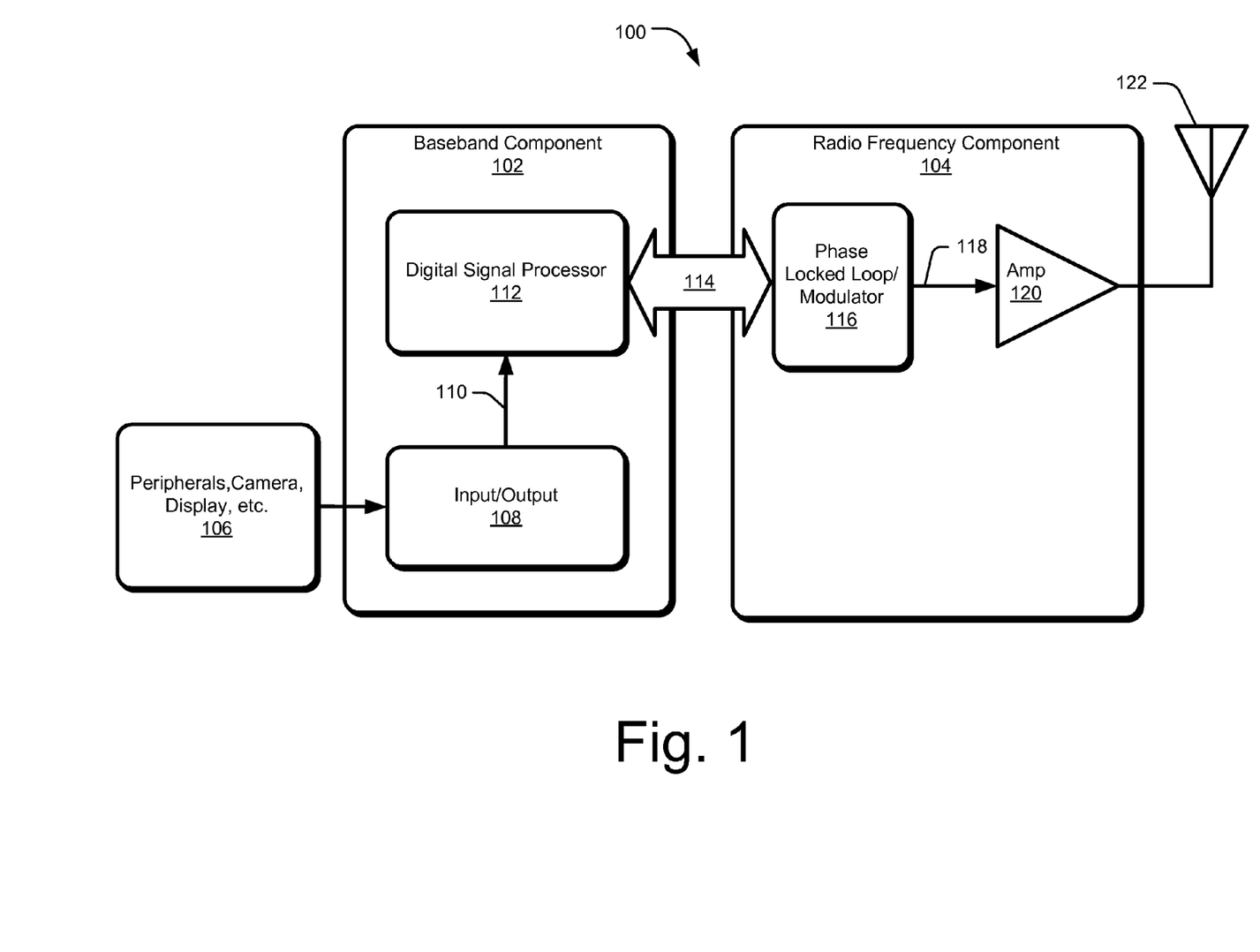
FIG. 1 is a block diagram illustrating a transmitter component.

FIG. 1 illustrates a transmitter 100 that includes a baseband component 102 and an RF component 104, providing transmission and reception of data. The baseband component 102 may produce a baseband signal used to modulate an RF frequency carrier of the RF component 104. The RF component 104 may provide the RF frequency carrier, which is phase modulated and amplitude modulated to produce a non-constant envelope phase modulated RF signal. In an implementation, the RF component 104 includes a set of subdivided mixer (sub-mixer) components to produce the non-constant envelope phase modulated RF signal. The set of sub-mixer components may include a single output to produce an output equivalence of the larger mixer used in the conventional topology. A phase modulated RF signal (also referred to as a local oscillator signal) may be received by the set of sub-mixer components, and amplitude modulated to produce the non-constant envelope phase modulated RF signal.

A signal from peripherals, camera, display etc. 106 may be received by Input/Output component (I/O) 108 for initial processing. The I/O component 108 may convert analog data signals into digital data signals, while the digital data signals may be maintained in the same state (i.e., remain digital). The I/O component 108 may process the data signals to produce an In-phase signal (I) and a Quadrature phase signal (Q).

The data signals output of I/O component 108 goes through path 110, and are received by a digital signal processor (DSP) 112. The DSP 112 may use a filter to limit the bandwidth, forming a spectrum of the baseband signal. The DSP 112 may include a Coordinate Rotation Digital Computer (CORDIC) component to transform the I and Q signals of the baseband signal into equivalent polar representations. The polar equivalence may contain the baseband phase signal and the baseband amplitude signal.

A digital interface 114 may connect the path for DSP 112 output which is received by a Phase Locked Loop/Modulator 116 component. The digital interface 114 may provide a bi-directional communications between the baseband component 102 and the RF component 104. The Phase Locked Loop/Modulator 116 component may perform phase modulation and amplitude modulation of the RF frequency carrier. In an implementation, the Phase Locked Loop/Modulator 116 component may include the phase locked loop (PLL) component for phase modulation of the RF frequency carrier, a set of subdivided DAC (sub-DAC) components to transform the digital baseband amplitude signal into analog baseband signals, and the set of sub-mixer components for amplitude modulation of the phase modulated RF signal.

The non-constant envelope phase modulated RF signal from the output of Phase Locked Loop/Modulator component 116 may pass through path 118, and received by an amplifier 120. The amplifier 120 may amplify the non-constant envelope phase modulated RF signal before transmission through an antenna 122.

Figure 2:
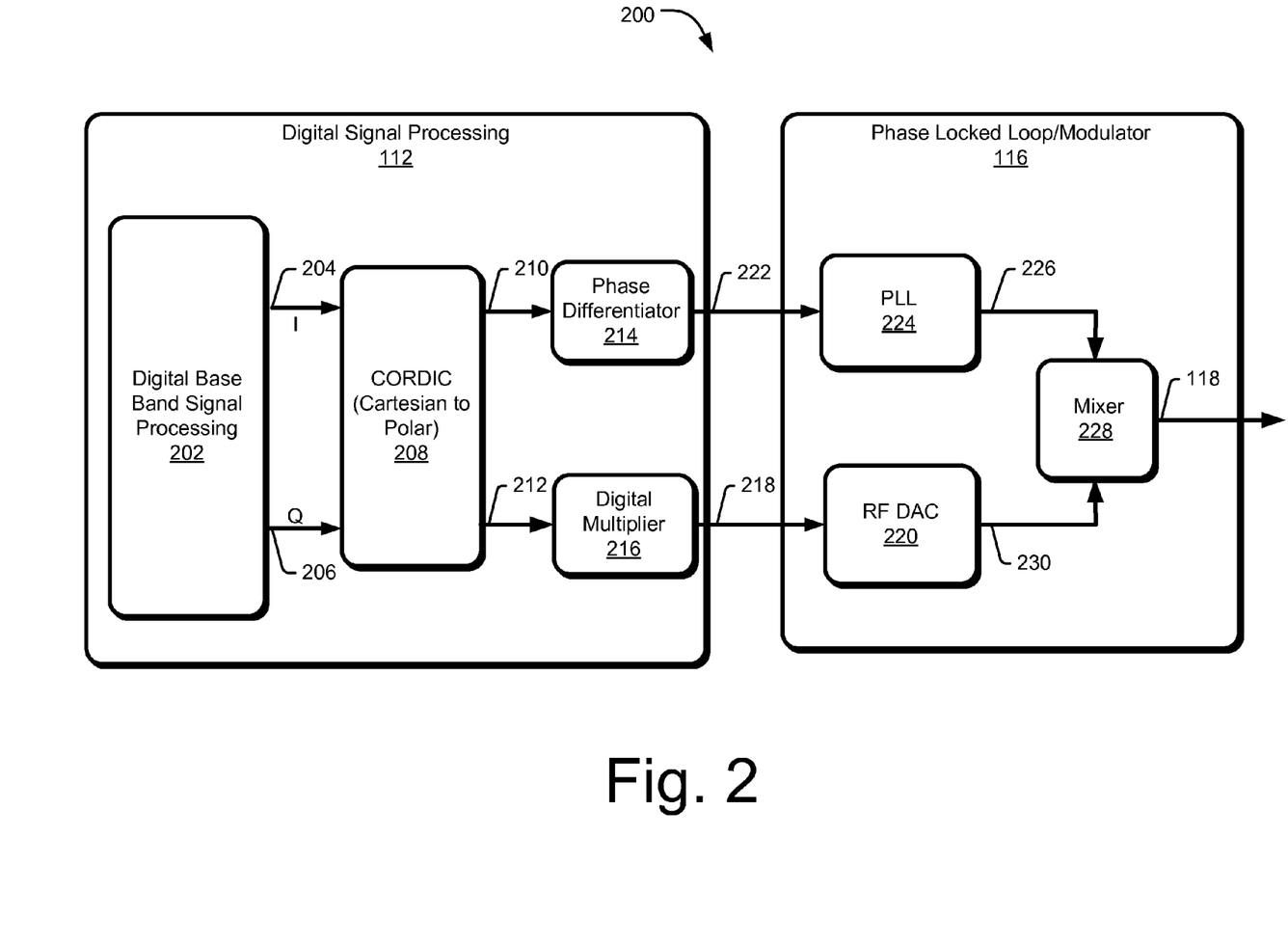
FIG. 2 is a block diagram illustrating a process of phase modulation with amplitude modulation.

FIG. 2 illustrates a block diagram 200 that provides a transformation of the data signals by DSP 112 into a polar equivalent baseband signal, and phase/amplitude modulation by the Phase Locked Loop/Modulator component 116 to produce the non-constant envelope phase modulated RF signal. A digital baseband signal processing component 202 may filter the I and Q signals in order to produce the baseband signal. The baseband signal at the output of digital baseband signal processing component 202 includes the I signal passing through path 204 and the Q signal passing through path 206.

The I and Q signals on path 204 and path 206 respectively, are received by the CORDIC 208. The CORDIC 208 transforms I signal and Q signal into their polar equivalence, which includes the baseband phase signal output on path 210 and the baseband amplitude signal output on path 212. The baseband phase signal output on path 210 is received by a phase differentiator 214 component which transforms the baseband phase signal into a baseband modulating frequency signal. The baseband amplitude signal output on path 212 is received by a digital multiplier 216 which may include multiplication of the baseband amplitude signal on path 212 by a programmable value in order to implement gain control (i.e., transmitted power level is regulated). The digital multiplier 216 may turn ON a portion or entire set of sub-mixer components, based upon the transmitted power level that is regulated in the digital processing of the baseband amplitude signal on path 212. A path 218 may include a digitally processed baseband amplitude signal output of the digital multiplier 216 and received by a RF DAC component 220. The RF DAC component 220 may convert the digitally processed baseband amplitude signal into the analog baseband signals. As discussed below, the RF DAC component 220 includes the set of sub-DAC components i.e., sub-DAC components 220-1, 220-2, ... 220-N, where "N" is an integer.

The baseband modulating frequency signal may pass through path 222 and received by a PLL 224. The PLL 224 may be used to modulate the RF frequency carrier, with the baseband modulating frequency signal from path 222, to produce the phase modulated RF signal on path 226. The phase modulated RF signal on path 226 may contain a differential signal which is received by a mixer component 228. The mixer component 228, as discussed below, includes the set of sub-mixer components 228-1, 228-2, ... 228-N which are connected in parallel. An individual sub-mixer component (e.g., sub-mixer component 228-1) processes a fraction of the analog baseband signals, and is proportional in size to a maximum level of the fraction of the analog baseband signals received (i.e., by the individual sub-mixer component). The sum of the fractions is equal to the whole baseband signal. As discussed below, the processing of smaller signals reduces the local oscillator leakage and distortions. The differential signal received by the mixer component 228 may include a positive signal (i.e., LO signal) and a negative signal (i.e., LOX signal) of the phase modulated RF signal on path 226.

The differential signal received by the mixer component 228 may undergo amplitude modulation from a signal on path 230. The signal on path 230 includes the output of the RF DAC component 220 which contains the analog baseband signals. The output of the RF DAC component 220 includes a first analog baseband signal, a second analog baseband signal and so on. As shown below, the first analog baseband signal may include an output of the first sub-DAC component 220-1, the second analog baseband signal may include an output of the second sub-DAC component 220-2, and so on.

Figure 3:
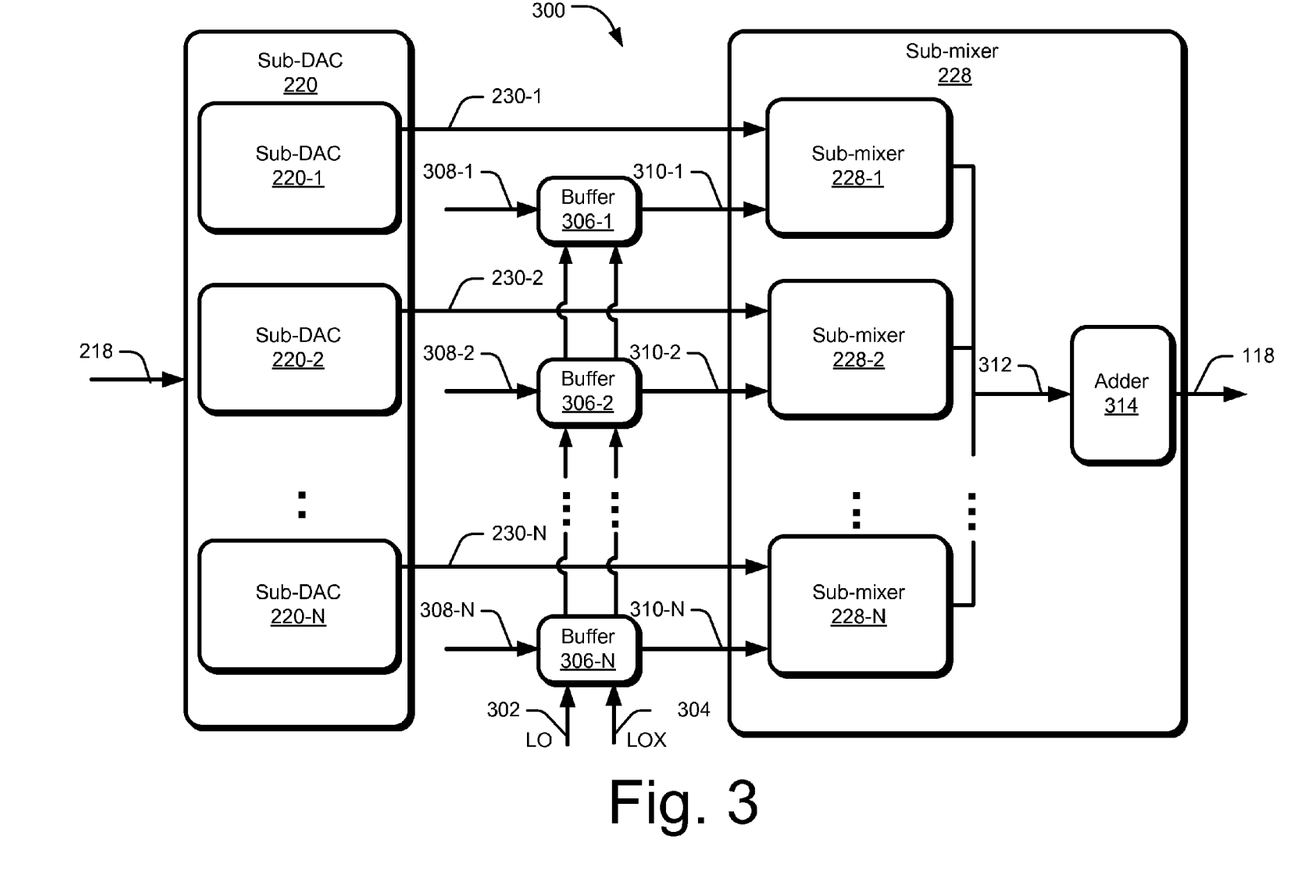
FIG. 3 is a block diagram illustrating an exemplary transmission section of a modulator implemented with variable-size mixers.

FIG. 3 illustrates a block diagram 300 illustrating an exemplary implementation of a modulator component which includes the sub-DAC components 220 and the sub-mixer components 228. The sub-mixer components 228 include an adder component 314. The exemplary implementation of the modulator component decreases the distortion and the LO leakage in an output frequency signal. The order in which the blocks of the system are described is not intended to be construed as a limitation, and any number of the described system blocks can be combined in any order to implement the system, or an alternate system. Additionally, individual blocks may be deleted from the system without departing from the spirit and scope of the subject matter described herein. Furthermore, the system can be implemented in any suitable hardware, software, firmware, or a combination thereof, without departing from the scope of the invention The digitally processed baseband amplitude signal from path 218 is received by the RF DAC component 220 which is subdivided into "N" sub-DAC components i.e., sub-DAC components 220-1, 220-2, ... 220-N, collectively referred to as the set of sub-DAC components 220. The set of sub-DAC components 220 may transform the digital baseband signal from path 218 into N analog baseband signals i.e., analog baseband signals 230-1, 230-2, ... 230-N. As there are N outputs, there can be N corresponding set of sub-mixer components in the mixer component 228 (i.e., sub-mixer components 228-1, 228-2, ... 228-N), hereinafter referred to as the set of sub-mixer components 228. The set of sub-mixer components 228 receives the N analog baseband signals (i.e., analog baseband signals 230-1, 230-2, ... 230-N), from the set of sub-DAC components 220. The set of sub-mixer components 228 includes individual sizes that are proportional to a maximum output current (i.e., maximum level) produced by the corresponding set of sub-DAC components 220 (i.e., analog baseband signals 230-1, 230-2, ... 230-N). The set of sub-mixer components 228 may be independently switched ON and OFF. The switching ON and OFF is determined by the transmitted power level that is regulated in the digital processing of the baseband amplitude signal. The switching ON and OFF of the set of sub-mixer components 228 is further determined by the amplitude modulation as further discussed below.

In an implementation, if some of the set of sub-mixer components 228 do not receive the analog baseband signals during a transmission burst (e.g., there is a decrease in transmission gain as implemented by the digital multiplier component 216), then the part of the set of sub-mixer components 228 can be switched OFF during the entire transmission burst. The switched OFF part of the set of sub-mixer components 228, during the entire transmission burst, is hereinafter referred to as a first subset of the set of sub-mixer components 228. The first subset may include one or more sub-mixer components from the set of sub-mixer components 228 that do not receive the analog baseband signals due to the gain control regulation (e.g., based on a desired signal level of the output frequency signal). The other one or more sub-mixer components that may receive the analog baseband signals (i.e., turned ON) are included in a second subset of the set of sub-mixer components 228. The switching OFF of the first subset during the entire transmission burst may allow a decrease in the LO leakage.

In another implementation, if the second subset of the set of sub-mixer components 228 does not process the analog baseband signals during a part of the transmission burst (e.g., due to amplitude modulation), then the second subset may be dynamically turned ON and OFF to further decrease the LO leakage. The dynamic switching of the second subset may continue if the digital multiplier component 216 does not introduce a new adjustment in the gain control regulation. The second subset (i.e., number of sub-mixer components) may further be based upon the desired signal level of the output frequency signal in the modulator. As such, the number of sub-mixer components to be used may be determined based upon the gain regulation and the amplitude modulation to be implemented in the output frequency signal.

A path 302 may supply the positive side (i.e., LO signal) of the differential signal in the phase modulated RF signal on path 226. In conjunction with the positive side, a path 304 also supplies the negative side (i.e., LOX signal) of the differential signal in the phase modulated RF signal on path 226. The LO and LOX signals may be received by buffer components 306-1, 306-2, ... and 306-N, collectively referred to as the buffer component 306. The buffer components 306-1, 306-2, ... and 306-N are respectively connected to the set of sub-mixer components 228. The buffer component 306 regenerates the local oscillator signal, allowing optimum driving conditions to the sub-mixer components 228. The buffer component 306 may be enabled by enable switch components 308-1, 308-2, ... 308-N, collectively referred to as enable switch components 308. The enable switch components 308 are respectively connected to the buffer component 306. The enable switch components 308 may be used to turn OFF and ON the subset of the set of sub-mixer components 228. The buffer component 306 may include N output signals that passes through paths 310-1, 310-2, ..., and 310-N. The N output signals on paths 310-1, 310-2, ... and 310-N are respectively received by the set of sub-mixer components 228. The set of sub-mixer components 228 mixes the N analog baseband signals to the corresponding N output signals on paths 310-1, 310-2, ... and 310-N. To this end, the sub-mixer component 228-1 may provide a first modulated signal output, the sub-mixer component 228-2 may provide a second modulated signal output, and so on.

The first modulated signal output, the second modulated signal output, and so on, may pass through a path 312 and received by an adder component 314. The adder component 314 combines the first modulated signal output, the second modulated signal output, and so on, from path 312. To this end, the adder component 314 produces an output frequency signal which includes the non-constant envelope phase modulated RF signal in the given implementation.

In an implementation, the enable switch component 308-1 may turn ON the buffer component 306-1 to supply differential signals LO and LOX, from paths 302 and 304 respectively, to the sub-mixer component 228-1. The sub-mixer component 228-1 mixes the differential signals LO and LOX, with the analog baseband signal from path 230-1. An output of the sub-mixer component 228-1 may include the first modulated signal output that will be added to the output of the rest of the set of sub-mixer components 228 (i.e. sub-mixer component 228-2, 228-3, ... 228-N). The sum of the output (i.e., using the adder component 314) of the set of sub-mixer components 228 may include the non-constant envelope phase modulated RF signal on path 118. The sub-mixer component 228-1 may be disabled dynamically, for part of the transmission burst, if the sub-mixer component 228-1 is not receiving any analog baseband signals due to amplitude modulation. In other words, the dynamic switching of the sub-mixer component 228-1 may be determined by an instantaneous value of the varying baseband signals based on the amplitude modulation.

Figure 4:
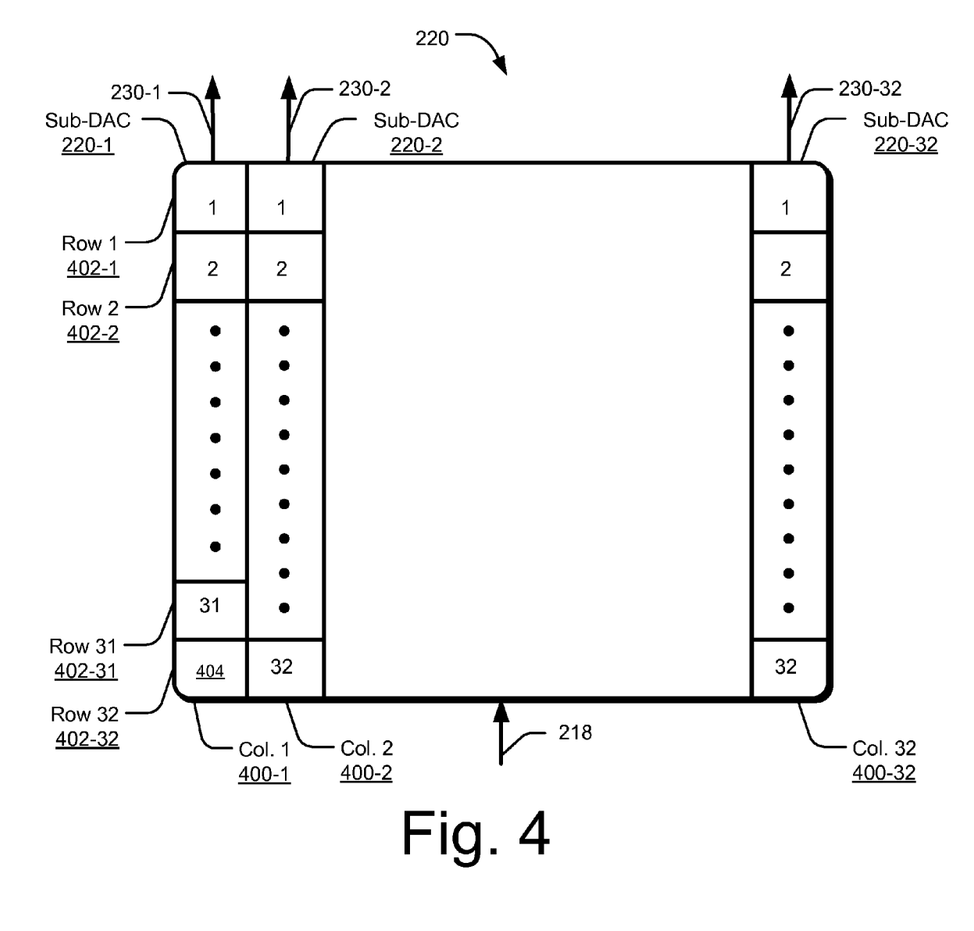
FIG. 4 is a block diagram illustrating an exemplary implementation of a RF Digital-to-Analog Converter (DAC) used in a transmitter.

FIG. 4 illustrates an exemplary implementation of a multi-bit set of sub-DAC components 220 (e.g., 10-bit thermometer-coded DAC) to achieve linear output with minimum distortion and LO leakage in the set of sub-mixer components 228 as previously described.

The digitally processed baseband amplitude signal on path 218 may be received and converted by the multi-bit set of sub-DAC components 220 into analog baseband signals. In an implementation, the multi-bit set of sub-DAC components 220 may include $2^{10}-1$ switchable current source cells that can be turned ON corresponding to a 10 bit digital input representing the digitally processed baseband amplitude signal from path 218. Each DAC cell in the multi-bit set of sub-DAC components 220 may include an active current source which is grounded when not activated, or switched to the corresponding path 230 (e.g., path 230-1, 230-2, ... 230-32) if activated.

In the present example, the multi-bit set of sub-DAC components 220 includes $2^{10}-1$ or 1023 DAC cells that are subdivided and arranged in $2^{10/2}$ rows and columns, i.e. 32 rows by 32 columns. The arrangement of 32 rows and 32 columns is shown in FIG. 4. The 32 columns are referred to as path 400-1 for Column 1, path 400-2 for Column 2, ..., path 400-32 for Column 32; and similarly, the 32 rows are referred to as path 402-1 for Row 1, 402-2 for Row 2, ..., path 402-32 for Row 32. Each column shows 32 DAC cells; however, the first column (Column 1) shows 31 DAC cells. In this example, the $32^{nd}$ or last DAC cell in the Column 1 is empty or "null" and is represented as 404.

The DAC cells in each column are grouped together, where each group can be designated as a sub-DAC component. Since there are 32 columns, there can be 32 groups resulting in 32 sub-DAC components. The 32 sub-DAC components include sub-DAC 220-1, sub-DAC 220-2, up to sub-DAC 220-32. The DAC cells in each column (e.g., columns 1, 2, 3, ... 32) are connected together to form a single output sub-DAC component as mentioned (e.g., sub-DAC 220-1, 220-2, ... 220-32). The single output sub-DAC component may include the maximum output current that is proportional to the size of the variable-size mixer used in the high gain range transmitter. The multi-bit set of sub-DAC components 220 processes a decimal coded value of the digital baseband amplitude signal on path 218 that is between 0 and 1023 by turning ON the corresponding number of DAC cells between 0 and 1023. For example, a decimal code 100 may be received by a 10-bit thermometer coded set of sub-DAC components 220 and converted into the analog baseband signals on path 230. The decimal code 100 may correspond to each and every DAC cell of the first 3 columns (i.e., 400-1, 400-2, and 400-3) and also the first 5 DAC cells of the $4^{th}$ column (i.e., 400-4) of the multi-bit set of sub-DAC components 220. The corresponding DAC cells are activated to ON state, thereby producing the analog baseband signals on path 230-1, path 230-2, path 230-3, and path 230-4 from the 4 sub-DAC components (e.g., sub-DAC 220-1, 220-2, 220-3 and 220-4). The 4 sub-DAC components (e.g., sub-DAC 220-1, 220-2, 220-3 and 220-4) output may be received by the corresponding sub-mixer components (e.g., sub-mixer 228-1, 228-2, 228-3 and 228-4) as shown in FIG. 4, to produce the non-constant envelope phase modulated RF signal.

In the example just described (i.e., decimal code 100 received by the multi-bit set of sub-DAC components 220), if the gain control regulation requires the first subset to include sub-mixers 228-5, 228-6, . . . 228-N, then the dynamic switching due to the amplitude modulation may be implemented only on the sub-mixers 228-1, 228-2, 228-3, and 228-4. The sub-mixers 228-1, 228-2, 228-3, and 228-4 are included in the second subset of the set of sub-mixer components 228. As discussed above, the second subset of the set of sub-mixer components 228 continues to be switched dynamically, if no new adjustment is introduced by the gain control regulation.

Figure 5:
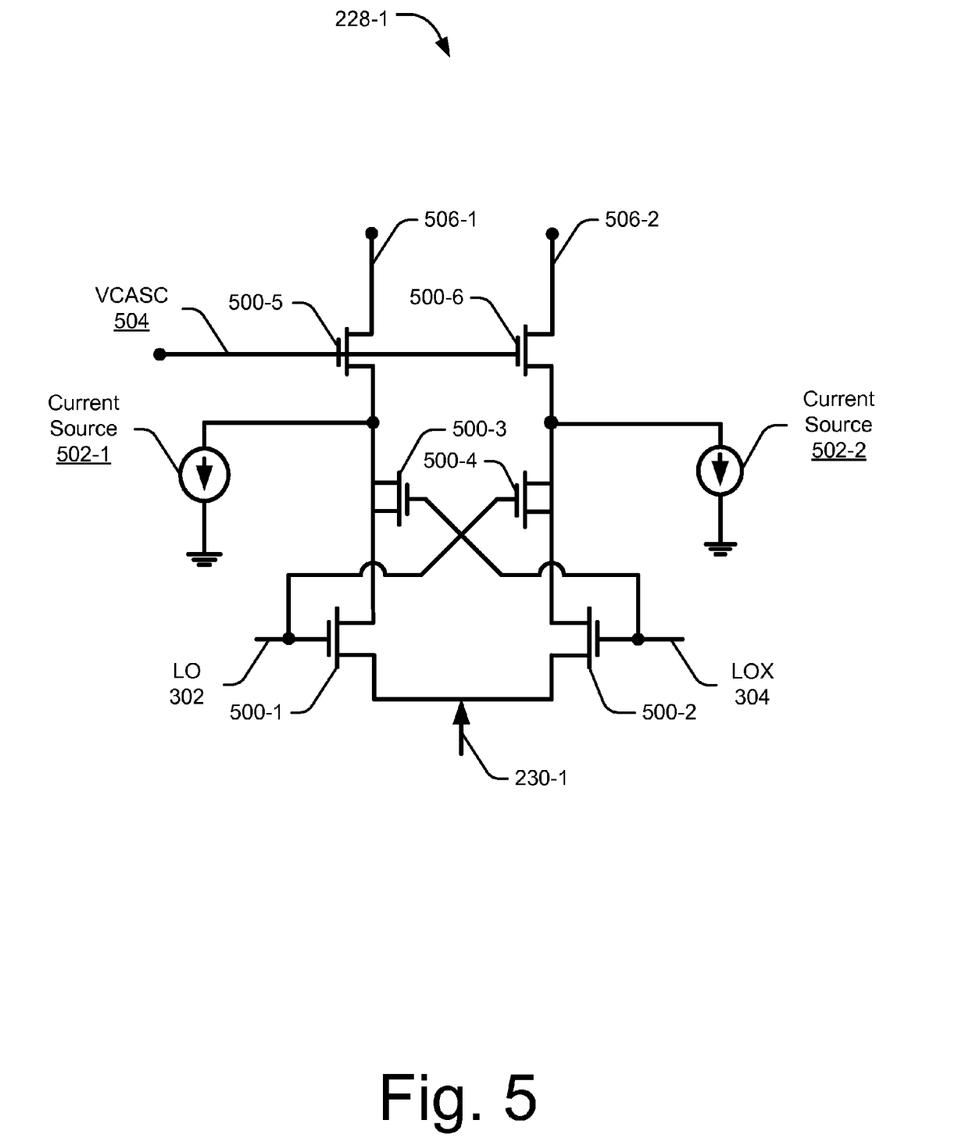
FIG. 5 is a block diagram illustrating an exemplary mixer implemented in a transmitter.

FIG. 5 illustrates an exemplary schematic diagram of the sub-mixer 228-1 implemented for modulation in a transmitter. The schematic diagram has been described with respect to one of the mixer component 228, and may include electronic components such as transistors, current sources, a voltage supply, and so on. The schematic diagram intends to provide a basic conceptual description of the sub-mixer 228-1 and does not limit the number of components present in the mixer component 228. In the following description, the components common to FIGS. 1-4 have been referred to by the same names and reference numbers.

In an implementation, the circuit of the sub-mixer 228-1 can be implemented via a differential NMOS circuit. The differential NMOS circuit can be realized with the use of n-channel MOSFETs 500-1, 500-2, . . . , 500-6 referred to respectively as NMOS 500-1, NMOS 500-2, . . . , NMOS 500-6, hereinafter. A common-source terminal of the NMOS 500-1 and the NMOS 500-2 may receive the analog baseband signal from path 230-1 and implement mixing of the analog baseband signal 230-1 with the differential signals LO and LOX received on paths 302 and 304 respectively. In certain embodiments, the differential input to the NMOS 500-1 and the NMOS 500-2 (i.e., LO and LOX signals) may use a buffer component where the enable signal 308-1 may be connected to turn ON or OFF the sub-mixer 228-1.

The NMOS 500-3 and the NMOS 500-4 may be implemented as cross-coupled transistors to cancel a charge-injection through gate-to-drain capacitances of NMOS 500-1 and NMOS 500-2, respectively. Furthermore, the NMOS 500-5 and the NMOS 500-6 may be cascode transistors to buffer the modulated RF signal output. The source terminals of the NMOS 500-5 and the NMOS 500-6 may receive current signals from a current source 502-1 and a current source 502-2 to keep the NMOS 500-5 and NMOS 500-6 biased at all gains. The gate terminals of the NMOS 500-5 and the NMOS 500-6 are driven by a voltage VCASC 504 for optimal operation. The differential output path 506-1 and path 506-2 are connected with the differential output of the rest of the set of sub-mixer components (e.g., sub-mixer 228-2, 228-3, . . . 228-N), to produce an output equivalence of the larger mixer component used in conventional topology less the distortions and LO leakages.

Figure 6:
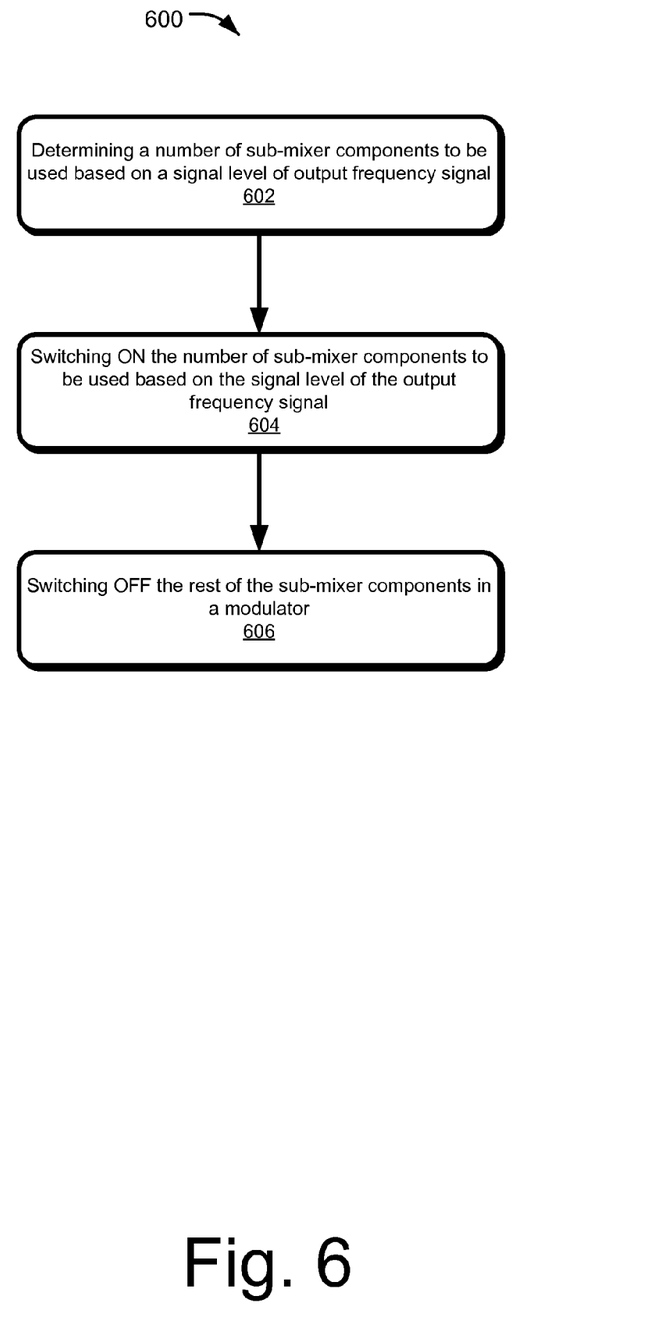
FIG. 6 is a flowchart illustrating an exemplary method for implementing a transmitter with variable-size mixers in a communication device.

FIG. 6 illustrates an exemplary method 600 for reducing distortion and local oscillator (LO) leakage. The exemplary method 600 is described with reference to FIGS. 1-5. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method can be implemented in any suitable hardware, software, firmware, or a combination thereof, without departing from the scope of the invention.

At block 602, determining a number of sub-mixer components is performed. For example, the number of sub-mixer components (e.g., sub-mixer components 228) to be used is determined based on a signal level of an output frequency signal.

At block 604, switching ON the number of sub-mixer components is performed. In an implementation, the number of sub-mixer components (e.g., second subset of the set of sub-mixer components) is turned ON to produce the output frequency signal.

At block 606, switching OFF the rest of the sub-mixer components is performed. For example, the rest of the sub-mixer components (e.g., first subset of the set of sub-mixer components) that were not turned ON in block 604, are turned OFF.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the systems described could be configured as wireless communication devices, computing devices, and other electronic devices.

What is claimed is:

1. An apparatus, comprising:
a digital to analog converter (DAC) component to convert a digital baseband signal, and to output a first analog baseband signal and a second analog baseband signal, each of the first analog baseband signal and the second analog signal being a distinct fraction of the digital baseband signal;
a first mixer component to modulate the first analog baseband signal and a phase-modulated frequency signal to generate a first modulated signal;
a second mixer component to modulate the second analog baseband signal and the phase-modulated frequency signal to generate a second modulated signal;
a component that receives the first modulated signal and the second modulated signal and provides an output frequency signal; and
an enable switch component; and
wherein at least one of the first and second mixer components is switchable, and the enable switch component is configured to cause at least one of the first and second mixer components to switch based on an instantaneous value of the first analog baseband signal and the second analog baseband signal.

2. The apparatus of claim 1, wherein at least one of the first and second mixer components is ON/OFF switchable.

3. The apparatus of claim 1, wherein each of the first and second mixer components is switchable.

4. The apparatus of claim 1, wherein the first mixer component and the second mixer component are independently switchable.

5. The apparatus of claim 1, wherein the DAC component includes multiple DAC cells.

6. The apparatus of claim 5, wherein the DAC component includes the multiple DAC cells that are subdivided to form N sub-DAC components connected to N mixer components.

7. The apparatus of claim 1, wherein the enable switch component is configured to cause at least one of the first and second mixer components to switch based on transmitted power level of the digital baseband signal.

8. The apparatus of claim 1, wherein the first mixer component and the second mixer component are connected in parallel.

9. The apparatus of claim 1, further comprising buffer components to supply a local oscillator (LO) signal to the mixer components.

10. The apparatus of claim 1, wherein at least one of the first and second mixer components is switchable to mitigate local oscillator leakage.

11. The apparatus of claim 1, wherein at least one of the first and second mixer components is dynamically switchable based on a gain control regulation of the output frequency signal.

12. The apparatus of claim 1, wherein the component that receives the first modulated signal and the second modulated signal and provides the output frequency signal is an adder.

13. A method, comprising:
  converting a digital baseband signal at a digital to analog converter (DAC);
  providing a plurality of fractional signals from the DAC including a first analog baseband signal from a first output of the DAC and a second analog baseband signal from a second output of the DAC, wherein a sum of the plurality of fractional signals is a representation of the digital baseband signal;
  receiving the first analog baseband signal, the second analogy baseband si nal and a phase-modulated local oscillator (LO) signals at a plurality of sub-mixer components;
  selecting sub-mixer components of the plurality of sub-mixer components based on an amplitude modulation of a frequency signal; and
  switching an operational state of at least one of the selected sub-mixer components based on an instantaneous value of the first analog baseband signal and the second analog baseband signal.

14. The method of claim 13, further comprising switching OFF an operational state of at least one sub-mixer component not being selected in the selecting act.

15. The method of claim 13, wherein the operational is an ON operational state of the at least one of the selected sub-mixer components.

16. The method of claim 13, wherein the switching act dynamically switches the operational state of at least one of the selected sub-mixer components based on the condition of the frequency signal.

* * * * *

UNITED STATES PATENT AND TRADEMARK OFFICE
CERTIFICATE OF CORRECTION

PATENT NO. : 9,059,661 B2
APPLICATION NO. : 13/829820
DATED : June 16, 2015
INVENTOR(S) : Jose Pedro Moreira Page 1 of 1

It is certified that error appears in the above-identified patent and that said Letters Patent is hereby corrected as shown below:

On the Title page, in item (71), in "Applicant", in column 1, line 1, after "GmbH", insert --, Neubiberg (DE)--, therefor In column 10, line 1-2, in Claim 13, delete "analogy" and insert --analog--, therefor In column 10, line 2, in Claim 13, delete "si nal" and insert --signal--, therefor In column 10, line 16, in Claim 15, after "operational", insert --state--, therefor Signed and Sealed this
First Day of March, 2016

Michelle K. Lee
*Director of the United States Patent and Trademark Office*